(12) United States Patent
Hashiba et al.

(10) Patent No.: US 12,108,561 B2
(45) Date of Patent: Oct. 1, 2024

(54) ELECTRONIC APPARATUS AND COOLING MODULE

(71) Applicant: LENOVO (SINGAPORE) PTE. LTD., Singapore (SG)

(72) Inventors: Junki Hashiba, Yokohama (JP); Masahiro Kitamura, Yokohama (JP); Shunsuke Mashimo, Yokohama (JP)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 207 days.

(21) Appl. No.: 17/932,720

(22) Filed: Sep. 16, 2022

(65) Prior Publication Data

US 2023/0189471 A1   Jun. 15, 2023

(30) Foreign Application Priority Data

Dec. 9, 2021 (JP) ................................ 2021-200340

(51) Int. Cl.
*H05K 7/20* (2006.01)
*G06F 1/20* (2006.01)

(52) U.S. Cl.
CPC ......... *H05K 7/20145* (2013.01); *G06F 1/203* (2013.01); *H05K 7/20154* (2013.01); *H05K 7/20172* (2013.01); *H05K 7/20409* (2013.01)

(58) Field of Classification Search
None
See application file for complete search history.

(56) References Cited

U.S. PATENT DOCUMENTS

| | | | |
|---|---|---|---|
| 6,328,097 B1 | 12/2001 | Bookhardt et al. | |
| 2008/0112130 A1* | 5/2008 | Nakamura | H01L 23/467 361/679.54 |
| 2010/0073864 A1 | 3/2010 | Hwang et al. | |
| 2011/0310557 A1* | 12/2011 | Ooe | G06F 1/20 361/692 |
| 2013/0250515 A1 | 9/2013 | Wu et al. | |
| 2018/0088637 A1* | 3/2018 | Uchino | F28D 15/0275 |
| 2019/0037725 A1* | 1/2019 | Uchino | G06F 1/1616 |

FOREIGN PATENT DOCUMENTS

| | | |
|---|---|---|
| CN | 204129641 U | 1/2015 |
| JP | 11340669 A | 12/1999 |
| JP | 3084059 U | 2/2002 |
| JP | 2002190685 A | 7/2002 |
| JP | 2006024756 A | 1/2006 |
| JP | 2011119775 A | 6/2011 |
| JP | 2016181547 A | 10/2016 |
| JP | 2019023839 A | 2/2019 |

* cited by examiner

*Primary Examiner* — Mukundbhai G Patel
(74) *Attorney, Agent, or Firm* — SHIMOKAJI IP (57) ABSTRACT

An electronic apparatus includes a chassis, a heating element in the chassis, and a cooling module in the chassis to cool the heating element. The cooling module includes: a blower fan; a heat sink having a plurality of fins spaced to have a gap therebetween, a first face with a first gap from the first cover member, and a second face with a second gap from the second cover member; a seal member attached to the first face of the heat sink so as to surround the first face; and a cover sheet attached to a surface of the seal member so as to cover the first face of the heat sink, thus defining a duct between the cover sheet and the first face to let air from the blower fan pass through the duct.

7 Claims, 6 Drawing Sheets

ELECTRONIC APPARATUS AND COOLING MODULE

BACKGROUND OF THE INVENTION

Field of the Invention

The present invention relates to an electronic apparatus including a cooling module, and the cooling module.

Description of the Related Art

Electronic apparatuses such as laptop PCs are equipped with a cooling module to cool heat-generating elements such as a CPU (see, for example, Japanese Patent Publication No. 6469183). This type of cooling modules includes a heat sink and a blower fan to discharge heat generated from a CPU or the like and transported through a heat pipe, for example.

SUMMARY OF THE INVENTION

Some of cover members that constitute a chassis of the electronic apparatus may have an uneven shape on its inner face. If the heat sink faces this uneven shape, air from the blower fan will interfere with the uneven shape of the cover member and will not flow smoothly on the surface of the heat sink. In such a case, the cooling efficiency of the cooling module may be lowered at the heat sink, or high-temperature exhaust air flowing on the surface of the heat sink may flow back into the air inlet of the blower fan, thus degrading the cooling performance of the entire module.

In view of these problems of the conventional technology, the present invention aims to provide an electronic apparatus including a cooling module, and a cooling module, which are capable of enhancing the cooling performance.

An electronic apparatus according to the first aspect of the present invention includes: a chassis having a first cover member defining one of outer faces opposed along a thickness of the chassis, and a second cover member defining the other outer face; a heating element in the chassis; and a cooling module in the chassis to cool the heating element. The cooling module includes: a blower fan having an air inlet to take in air and an air outlet to discharge air; a heat sink having a plurality of fins spaced to have a gap therebetween, a first face with a first gap from the first cover member, a second face with a second gap from the second cover member, and a side face intersecting the first and second faces, the side face facing the air outlet; a seal member disposed in the first gap and attached to the first face of the heat sink so as to surround the first face; and a cover sheet attached to a surface of the seal member so as to cover the first face of the heat sink, thus defining a duct between the cover sheet and the first face to let air from the blower fan pass through the duct.

A cooling module according to the second aspect of the present invention is to be mounted in an electronic apparatus, and the cooling module includes: a blower fan having an air inlet to take in air and an air outlet to discharge air; a heat sink having a plurality of fins spaced to have a gap therebetween, a first face that is one of opposed faces in a standing direction of the fins, a second face that is the other face, and a side face intersecting the first and second faces, the side face facing the air outlet; a seal member attached to the first face of the heat sink so as to surround the first face; and a cover sheet attached to a surface of the seal member so as to cover the first face of the heat sink, thus defining a duct between the cover sheet and the first face to let air from the blower fan pass through the duct.

One aspect of the present invention enhances the cooling performance.

DETAILED DESCRIPTION OF THE INVENTION

Referring to the drawings, the following describes an electronic apparatus and a cooling module according to the present invention in details by way of a preferable embodiment.

Figure 1:
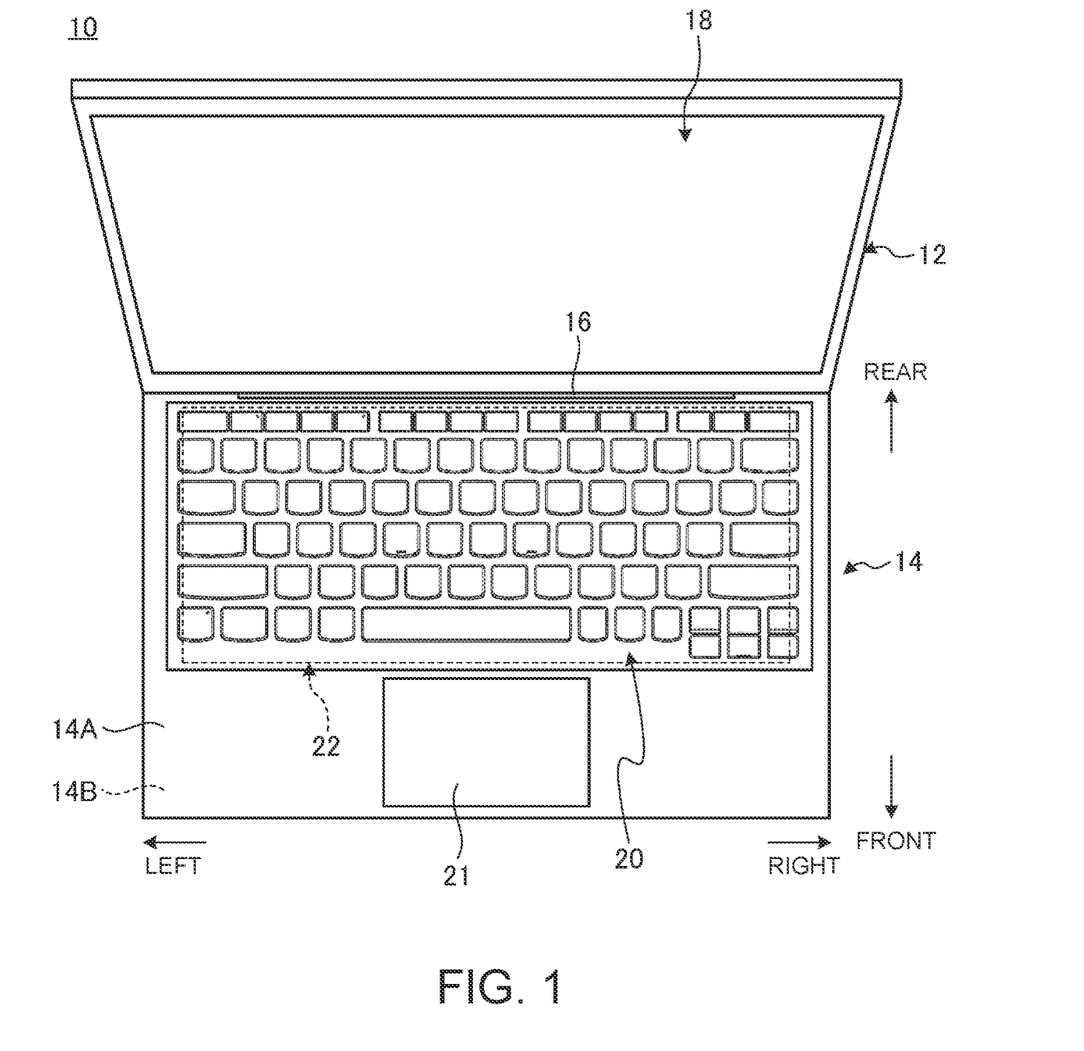
FIG. 1 is a schematic top plan view of an electronic apparatus according to one embodiment.

FIG. 1 is a schematic top plan view of an electronic apparatus 10 according to one embodiment. As illustrated in FIG. 1, the electronic apparatus 10 is a clamshell-type laptop PC including a display chassis 12 and a chassis 14 that are relatively rotatably connected with a hinge 16. The electronic apparatus of the present invention may be of various types other than the laptop PC, including a desktop PC, a tablet PC, a mobile phone, a smartphone, and a game machine.

The display chassis 12 is a thin, flat box. The display chassis 12 accommodates a display 18. In one example, the display 18 includes an organic light-emitting diode (OLED) or liquid crystal.

The following describes the chassis 14 and the elements mounted on this, assuming that, with reference to the posture of the chassis as illustrated in FIG. 1 allowing a user to operate a keyboard 20 on the top face of the chassis 14, a part closer to the user is front, a part away from the user is rear, the width is left and right, and the height (thickness of the chassis 14) is top and bottom.

The chassis 14 is a thin, flat box. The chassis 14 has a cover member 14A that defines the top face and the four surrounding side faces and a cover member 14B that defines the bottom face. The upper cover member 14A has a substantially bathtub shape with the bottom face open. The lower cover member 14B has a substantially flat plate shape, and serves as a lid that closes the bottom-face opening of the cover member 14A. These cover members 14A and 14B are overlapped in the thickness direction and are detachably connected to each other. The chassis 14 may be configured so that the cover member 14A has a flat plate shape and the cover member 14B has a bathtub shape. The top face of the chassis 14 includes a keyboard 20 and a touchpad 21. The chassis 14 is connected to the display chassis 12 at the rear end via the hinge 16.

Figure 2:
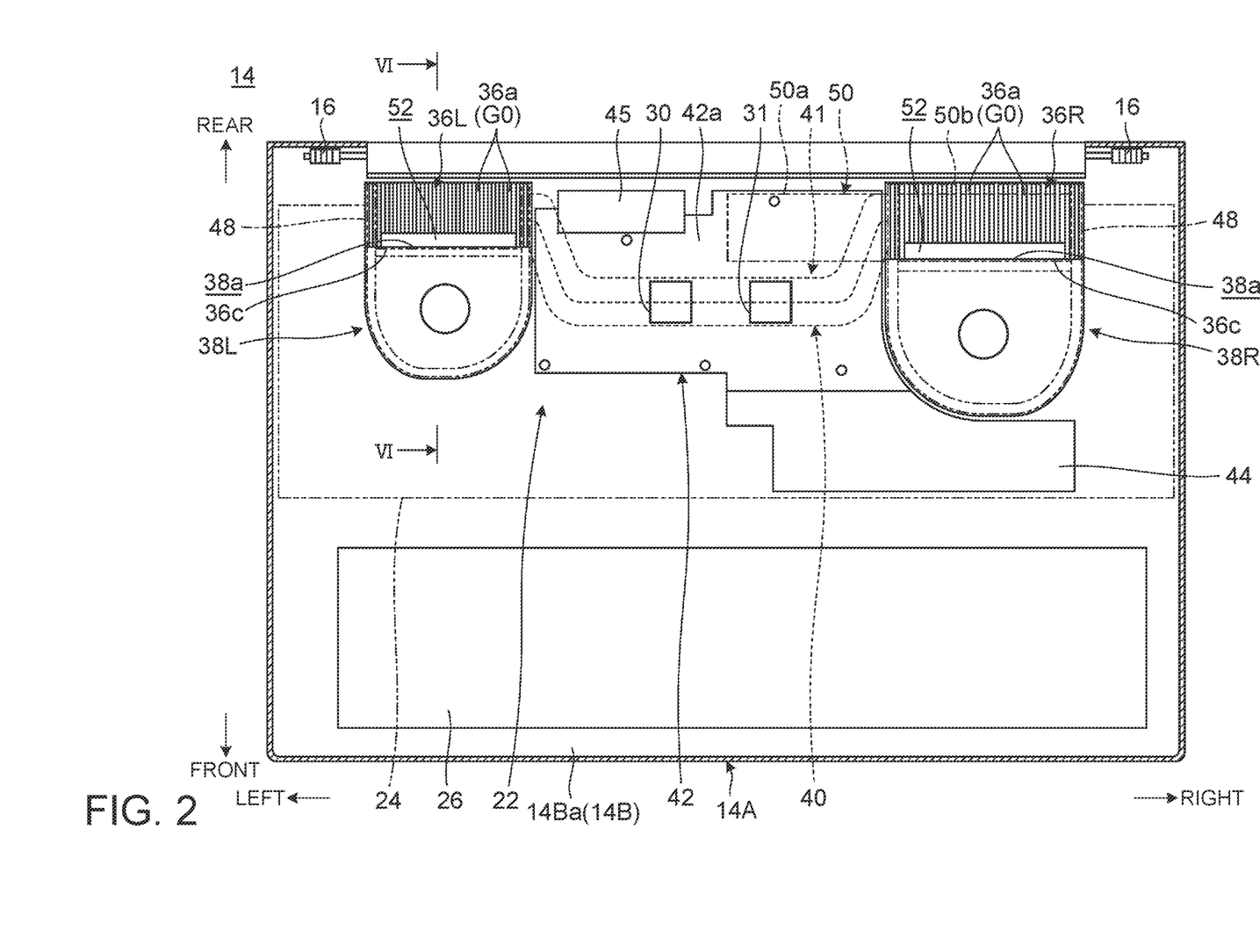
FIG. 2 is a plan view schematically illustrating the internal configuration of the chassis.

FIG. 2 is a plan view schematically illustrating the internal configuration of the chassis 14. FIG. 2 schematically illustrates the chassis 14 cut slightly below the keyboard 20.

As illustrated in FIG. 2, the chassis 14 accommodates a cooling module 22, a motherboard 24, and a battery unit 26. The chassis 14 also accommodates various electronic parts and mechanical parts.

The motherboard 24 is the main board of the electronic apparatus 10. The motherboard 24 is located closer to the rear of the chassis 14 and extends left to right. The motherboard 24 is a printed circuit board, on which a central processing unit (CPU) 30 and a graphics processing unit (GPU) 31 as well as various electronic components such as a communication module and a memory are mounted. The motherboard 24 is located under the keyboard 20 and is screwed to the back face of the keyboard 20 and the inner face 14Aa of the cover member 14A. The motherboard 24 has the top face that is to be attached to the cover member 14A, and the bottom face that is a mounting face, on which the CPU 30, the GPU 31 and others are mounted.

The CPU 30 performs calculations related to the main control and processing of the electronic apparatus 10. The GPU 31 performs calculations necessary to depict images such as 3D graphics. In the case of the electronic apparatus 10 of the present embodiment, the GPU 31 is a heating element with the largest amount of heat generated among the electronic components mounted in the chassis 14. The CPU 30 is the second largest heat generating element after the GPU 31.

The battery unit 26 is a rechargeable battery that serves as a power source for the electronic apparatus 10. The battery unit 26 is located in front of the motherboard 24 and extends left to right along the front edge of the chassis 14.

Next, the configuration of the cooling module 22 is described.

The cooling module 22 is a cooling unit that absorbs and diffuses the heat generated from the CPU 30 and the GPU 31 and discharges the heat to the outside of the chassis 14. The electronic components to be cooled by the cooling module 22 may be either one of the CPU 30 and the GPU 31 or other than these. The major part of the cooling module 22 is stacked on the bottom face of motherboard 24.

Figure 3:
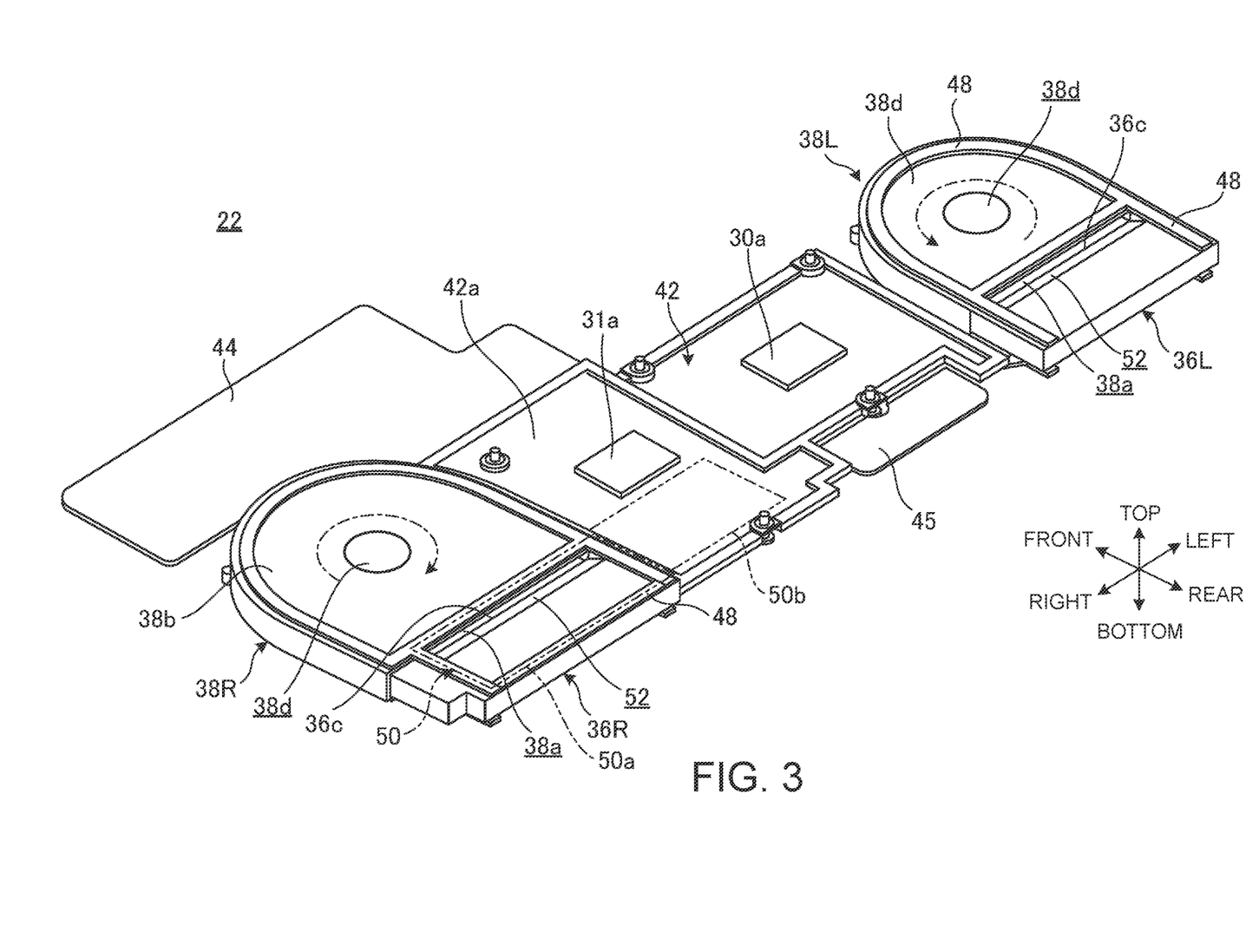
FIG. 3 is a perspective view of the cooling module viewed from the above.
Figure 4:
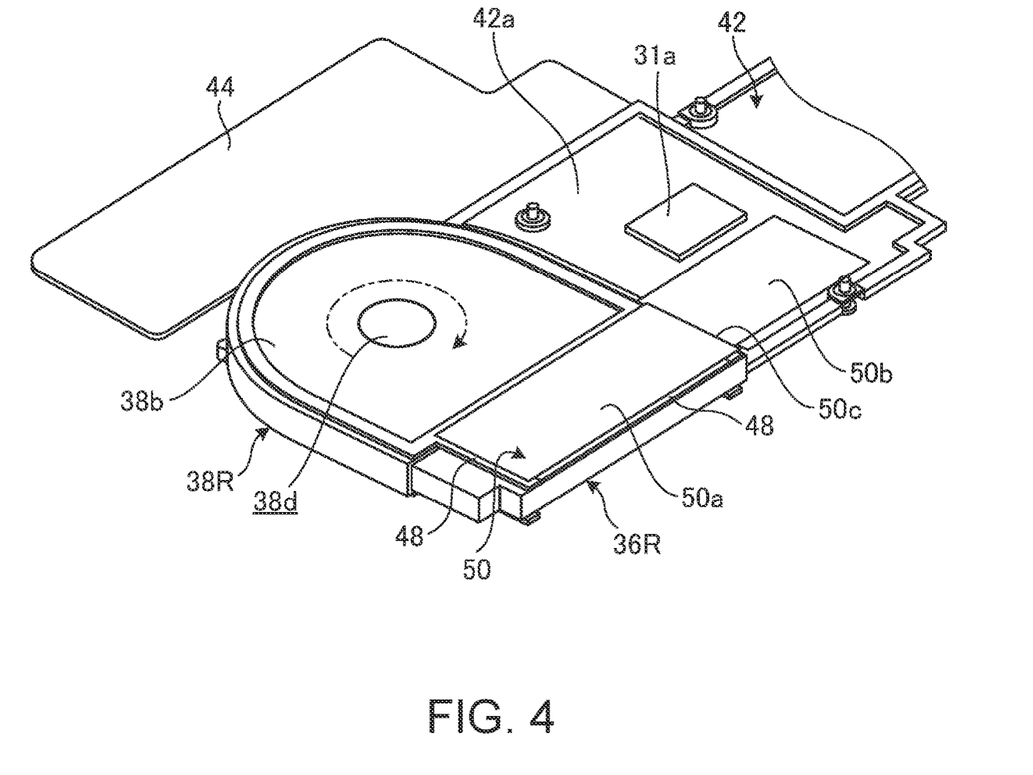
FIG. 4 is a partially enlarged view of the cooling module in FIG. 3.

FIG. 3 is a perspective view of the cooling module 22 viewed from the above. FIG. 4 is a partially enlarged view of the cooling module 22 in FIG. 3. As illustrated in FIGS. 2 to 4, the cooling module 22 includes a pair of left and right heat sinks 36L and 36R, a pair of left and right blower fans 38L and 38R, a pair of front and rear heat pipes 40 and 41, and a vapor chamber 42.

The cooling module 22 of the present embodiment is used for cooling the CPU 30 and the GPU 31. To this end, the cooling module 22 has a pair of heat sinks and a pair of blower fans. The cooling module 22 may have a configuration including one heat sink and one blower fan, depending on the target to be cooled, the required capacity, and other factors. The heat sinks 36L and 36R have the same or similar basic configuration, except that they are slightly different in size and shape. The blower fans 38L and 38R also have the same or similar basic configuration, except that they are slightly different in size and shape. The following therefore mainly describes the right heat sink 36R and blower fan 38R as a representative example, and a detailed description of the left heat sink 36L and blower fan 38L is omitted, with the same reference numerals assigned as those on the right.

As illustrated in FIGS. 2 to 4, the heat sink 36R is configured so that a plurality of plate-like fins 36a, extending in the front-rear direction and standing in the top-bottom direction, are equally spaced in the left-right direction. The adjacent fins 36a and 36a define a gap G0 therebetween, through which air sent from the blower fan 38R passes. The gap G0 penetrates in the front-rear direction, and a plurality of gaps are aligned in the left-right direction.

Figure 5:
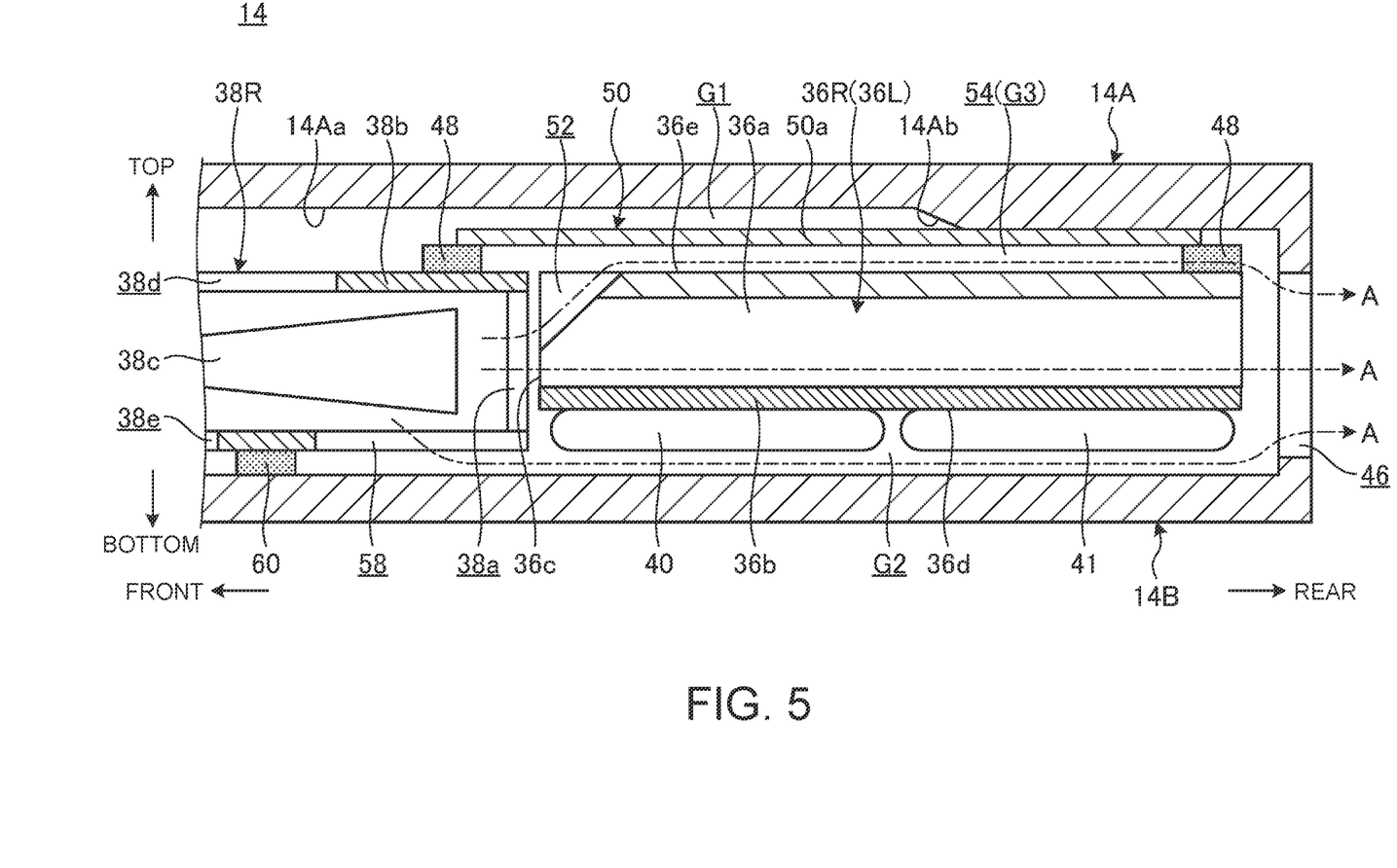
FIG. 5 is a side cross-sectional view schematically illustrating the internal configuration of the chassis.
Figure 6:
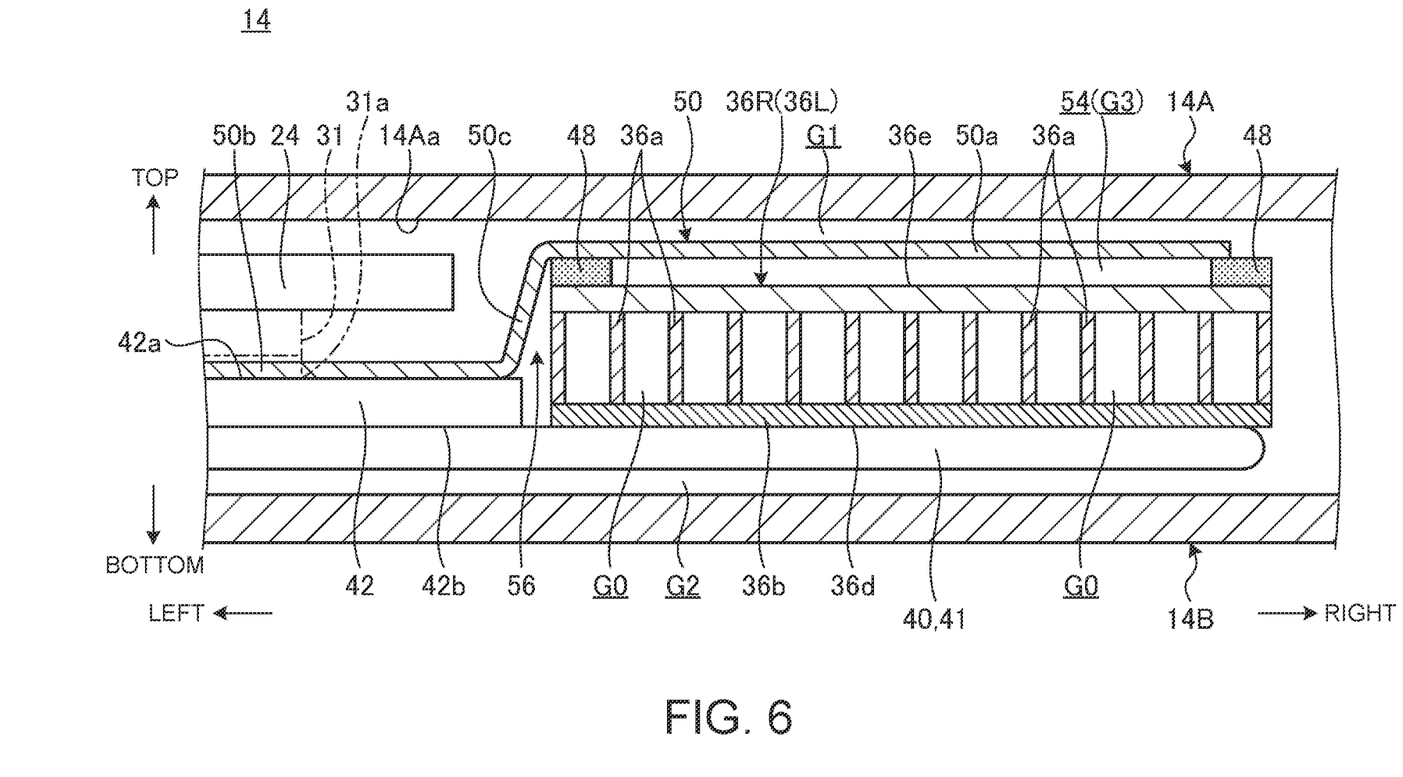
FIG. 6 is a front cross-sectional view schematically illustrating the internal configuration of the chassis.

In one example, the fins 36a are joined with a plate 36b at the lower end faces for integration (see FIGS. 5 and 6). The fins 36a may be joined also at the upper end faces with a plate for integration (see FIG. 6). These fins 36a and plate(s) 36b are plates made of metal with high thermal conductivity, such as aluminum or copper. In FIGS. 3 and 4, the fins 36a and plate(s) 36b are collectively illustrated schematically as one block.

As illustrated in FIGS. 2 to 4, the blower fan 38R is placed in front of the heat sink 36R, so that the air outlet 38a opened rearward faces the front side face 36c of the heat sink 36R. The blower fan 38R is a centrifugal fan that rotates an impeller 38c (see FIG. 5) housed inside a fan housing 38b by a motor. The fan housing 38b has an air inlet 38d opened to the top face and an air inlet 38e opened to the bottom face. One of the air inlets 38d and 38e may be omitted.

As illustrated in FIGS. 2, 5, and 6, the heat pipes 40 and 41 are a pipe-shaped heat transport device having a curved center part. The heat pipes 40 and 41 transport the heat of the CPU 30 and the GPU 31 to the heat sinks 36L and 36R. In this embodiment, two heat pipes 40 and 41 are used in parallel as a pair in front and rear, and one or three or more heat pipes may be used. In another example, the heat pipes include a heat pipe connecting the CPU 30 and the heat sink 36L and a heat pipe connecting the GPU 31 and the heat sink 36R so that these heat pipes are separately provided.

The heat pipes 40 and 41 are each a thin, flat metal pipe defining a closed space therein, into which working fluid is enclosed. The metal pipes are made of metal with high thermal conductivity, such as aluminum, copper, or stainless steel. The closed space is a flow channel, through which the enclosed working fluid flows while undergoing a phase change. Examples of the working fluid include water, CFC (chlorofluorocarbon) substitutes, acetone, and butane. In the closed space, a wick is provided, which sends the condensed working fluid by capillarity. In one example, the wick includes a mesh made by knitting fine metal wires into a cotton-like pattern and a porous body such as a fine flow channel.

As illustrated in FIGS. 2 to 4, the vapor chamber 42 is a plate-shaped heat transport device, which is one type of heat pipes. The vapor chamber 42 diffuses heat from the CPU 30 and the GPU 31 and transmits the heat to the heat pipes 40 and 41. The vapor chamber 42 includes two thin metal plates defining a closed space therebetween, in which working fluid is enclosed. For the vapor chamber 42, the material of the metal plates, the type of the working fluid, and the configuration of the wick provided in the closed space may be the same as those in the heat pipes 40 and 41 described above.

Reference numerals 44 and 45 in FIGS. 2 and 4 denote metal plates. The metal plates 44 and 45 are made of metal such as aluminum or copper, and are auxiliary heat diffusion members that additionally diffuse and discharge the heat diffused by the vapor chamber 42. Instead of the metal plates 44, 45, the vapor chamber 42 may be extended for this purpose.

In the cooling module 22 configured as described above, the top face 42a of the vapor chamber 42 is connected to the CPU 30 and the GPU 31 via heat receiving plates 30a and 31a, respectively. The heat receiving plates 30a and 31a made of metal with high thermal conductivity, such as copper and aluminum, may be omitted. The heat pipes 40 and 41 have central portions that are heat receiving portions joined to the bottom face 42b of the vapor chamber 42, and have both end portions that are heat radiating portions joined to the bottom faces 36d of the heat sinks 36L and 36R.

With this configuration, the heat generated from the CPU 30 and the GPU 31 is absorbed and diffused at the vapor chamber 42, and is efficiently transported to the heat sinks 36L and 36R via the heat pipes 40 and 41. Then the heat is discharged to the outside of the chassis 14 by the airflow of the blower fans 38L and 38R. The chassis 14 has an air outlet 46 that is opened in the rear wall so as to discharge the air passing through the heat sinks 36L and 36R to the outside. The heat diffused at the vapor chamber 42 is further diffused and discharged through the metal plates 44 and 45. The arrows indicated by dashed dotted lines in FIG. 5 schematically illustrate the flow of air A discharged from the blower fan 38R.

Next, the following describes a more detailed structure of the heat sink 36R and its peripheral portion.

FIG. 5 is a side cross-sectional view schematically illustrating the internal configuration of the chassis 14. FIG. 6 is a front cross-sectional view schematically illustrating the internal configuration of the chassis 14. FIG. 5 illustrates a view of the chassis 14 cut along a vertical plane extending in the front-rear direction at a position passing through the heat sink 36R and the blower fan 38R. FIG. 6 illustrates a view of the chassis 14 cut along a vertical plane extending in the left-right direction at a position passing through the heat sink 36R.

As illustrated in FIGS. 5 and 6, the heat sink 36R is placed to have a gap G1 between the top face 36e and the inner face 14Aa of the cover member 14A and a gap G2 between the bottom face 36d and the inner face 14Ba of the cover member 14B. The heat sink 36L is also placed within the chassis 14 in substantially the same manner as the heat sink 36R.

As illustrated in FIGS. 3 to 6, a seal member 48 and a cover sheet 50 are placed on the top face 36e of the heat sink 36R. The heat sink 36R of the present embodiment also has a chamfered duct introducing portion 52 at a corner between the top face 36e and the side face 36c. To the bottom face 36d of the heat sink 36R, the heat pipes 40 and 41 are connected.

As illustrated in FIGS. 3 and 4, the seal member 48 has a rectangular frame shape so as to surround the outer peripheral edge of the top face 36e of the heat sink 36R, and is adhesively fixed to the top face 36e. In one example, the seal member 48 extends like a band and has cushioning properties as in sponge or rubber. In this embodiment, the seal member 48 is fixed also to the outer peripheral edge of the top face of the blower fan 38R, surrounding the air inlet 38d. The seal member 48 has one side surrounding the top face 36e of the heat sink 36R, and this side extends in the left-right direction in front of the air outlet 38a of the blower fan 38R.

The seal member 48 is placed in the gap G1 and closes the space between the top face 36e and the inner face 14Aa of the cover member 14A. With this configuration, the seal member 48 is a part of the duct 54. The duct 54 is an air path for circulating the air A sent from the blower fan 38R along the top face 36e of the heat sink 36R. The heat sink 36R is likely to become hot at the lower part due to the heat of the heat pipes 40, 41, but does not increase in temperature at the upper part that is away from the heat pipes 40, 41. The duct 54 is configured to circulate low-temperature air from the blower fan 38R along the top face 36e, thus promoting the heat discharge from the upper part of the heat sink 36R.

As illustrated in FIG. 5, the inner face 14Aa of the cover member 14A of the present embodiment has a projection 14Ab, for example, to have an uneven shape. Therefore, as illustrated in FIGS. 5 and 6, a part of the seal member 48 fails to be in close contact with the inner face 14Aa, for example, thus creating a gap and causing air leakage from the duct 54. This air leakage not only reduces the heat discharge efficiency of the heat sink 36R, but also reduces the cooling performance of the entire cooling module 22 due to a concern that the leaked hot air may flow back into the air inlet 38d. Even if the inner face 14Aa of the cover member 14A is flat without unevenness, the height of the gap G1 may be large so that it is difficult to bring the seal member 48 into close contact with the top face 36e and the inner face 14Aa. Such a case also has the problems of air leakage and reduced heat discharge efficiency.

To cope with these problems, the cooling module 22 in this embodiment has a cover sheet 50 attached to the surface of the seal member 48 to tent the top face 36e of the heat sink 36R, thus forming a duct 54 that is well-sealed and not too high.

As illustrated in FIGS. 3 through 6, the cover sheet 50 is a thin sheet-like member that is rectangular in shape, for example. The cover sheet 50 straddles the top face 36e of the heat sink 36R in the direction of arranging the fins 36a, and partially extends to the top face 42a of the vapor chamber 42.

In one example, the cover sheet 50 is made of a graphite sheet, a metal sheet such as copper or aluminum, or a resin sheet such as polyethylene terephthalate (PET). Preferably the cover sheet 50 is a heat conductive sheet made of a material with high thermal conductivity, such as graphite or copper. The cover sheet 50 in this embodiment includes a graphite sheet, which has extremely high thermal conductivity.

The cover sheet 50 has a first portion 50a and a second portion 50b.

The first portion 50a covers the top face 36e of the heat sink 36R. The first portion 50a is placed in the gap G1 and adhesively fixed to the top face of the frame-shaped seal member 48 surrounding the top face 36e. Specifically, the first portion 50a covers from the top face 36e of the heat sink 36R to a portion of the top face of the blower fan 38R across the air outlet 38a in the front-rear direction, and covers most of the top face 36e in the left-right direction.

When the heat sink 36R does not have the duct introduction portion 52, the seal member 48 may be placed only on the outer periphery of the top face 36e. In this case, the first portion 50a is shaped to cover only the top face 36e of the heat sink 36R in the front-rear direction.

The first portion 50a defines a gap G3 with the top face 36e, the gap G3 having the same height as the thickness of the seal member 48. The gap G3 is the internal space of the duct 54 and is surrounded by at least the top face 36e, the cover sheet 50 and the seal member 48.

The second portion 50b extends leftward from the first portion 50a and is adhesively fixed to the top face 42a of the vapor chamber 42. The second portion 50b absorbs heat from the vapor chamber 42 and transports it to the first portion 50a. The second portion 50b may be omitted as in Example 1 in Table 1, which will be described later.

In this embodiment, the height of the heat sink 36R in the top-bottom direction is approximately 11 mm, and the thickness of the vapor chamber 42 is approximately 1.2 mm. The bottom face 36d of the heat sink 36R is positioned substantially flush with the bottom face 42b of the vapor chamber 42 (see FIG. 6). This means that the top faces 36e and 42a have a step 56 of approximately 9.8 mm therebetween. The cover sheet 50 has a bend 50c between the portions 50a and 50b, and this bend 50c extends over the step 56. The thickness of the heat pipes 40, 41 is approximately 1.4 mm.

As illustrated in FIG. 4, the GPU 31 and the second portion 50b of the cover sheet 50 are connected to different areas of the top face 42a of the vapor chamber 42. That is, the cooling module 22 connects the second portion 50b of the cover sheet 50 using the redundant top face 42a of the vapor chamber 42, which typically has a larger surface area than the GPU 31. With this configuration, the cooling module 22 prevents the GPU 31 and the cover sheet 50 from interfering with each other, while improving the space efficiency to install both of the components.

As illustrated in FIGS. 3 to 5, the duct introduction portion 52 is a chamfer at the corner between the top face 36e and the side face 36c of the heat sink 36R. In one example, the duct introducing portion 52 is formed at the corners of most of the fins 36a except for both ends in their arranging direction. The lower end of the duct introduction portion 52 is positioned at or in the vicinity of the vertical center of the opposing air outlet 38a of the blower fan 38R. Thus, the duct introduction portion 52 defines an air path through which the air discharged from the air outlet 38a smoothly flows into the duct 54.

For example, the duct introduction portion 52 may be omitted when the side face 36c and the air outlet 38a have a gap therebetween as illustrated in FIG. 5, when the air outlet 38a protrudes upward above the top face 36e, or when the top face 36e does not have a plate illustrated in FIG. 6 and the gap G0 is open at the top face 36e. This is because, in these cases, the air from the air outlet 38a sufficiently flows through the duct 54 without the duct introducing portion 52. When the heat sink 36R does not have the plate illustrated in FIG. 6 on the top face 36e, the virtual plane including the upper end face of each fin 36a is effectively the top face 36e, and the same applies to the side face 36c without the plate.

Next, the effect of improving the cooling performance of the cover sheet 50 will be described, by way of experimental results.

For experiment, Example 1 and Example 2 of cooling modules 22 were prepared as follows. In Example 1, a cover sheet 50 was a PET resin sheet, without the second portion 50b. In Example 2, a cover sheet 50 was a graphite sheet, with the portions 50a and 50b. These cooling modules 22 were mounted on the electronic apparatus 10 and the temperatures of various parts were measured. Table 1 shows the experimental results of Examples 1 and 2.

As indicated in Table 1, the temperatures of most of the measurement positions in Example 2, specifically the CPU 30 (CPU temp.), the GPU 31 (GPU temp.), the surface of the keyboard 20 (key top temp.), and the cover member 14B (lower cover member temp.) were lower than those in Example 1. This shows that the cooling performance of the cooling module 22 improves by the cover sheet 50 that is a heat conductive sheet such as a graphite sheet and by the first portion 50a and the second portion 50b.

Presumably, the first reason for these results may be that heat from the vapor chamber 42 in Example 2 was efficiently transported from the second portion 50b to the first portion 50a due to the cover sheet 50 that was a graphite sheet, and this example enabled efficient cooling by air from the blower fan 38R flowing through the duct 54. For the second reason, the heat sink 36R used in this experiment had a large height of 11 mm. Therefore, the heat from the high-temperature heat pipes 40 and 41 in Example 1 was cooled before it moved to the upper portion of each fin 36a, and the upper portions of the fins 36a contributed less to the cooling performance of the cooling module 22. In contrast, Example 2 effectively utilized the upper portions of the fins 36a due to the heat from the vapor chamber 42 transported from the second portion 50b, resulting in improved cooling performance of the cooling module 22. That is, the cooling module 22 utilizes the height of the heat sink 36R and is configured to sandwich the heat sink 36R between the duct 54 of the cover sheet 50 and the heat pipes 40, 41 to achieve high cooling efficiency.

Note that, as indicated in Table 1, the temperature of the cover member 14A (upper cover member temp.) was lower in Example 1 than in Example 2. A possible reason for this is that, in Example 2, the heat of the vapor chamber 42 was transported to the upper portion of the heat sink 36R adjacent to the cover member 14A, and the transported heat increased the temperature of the cover member 14A. However, as is clear from Table 1, the temperature of the cover member 14A in Example 2 was sufficiently low at 37.7° C., and this can be considered no practical problem. In particular, when the airflow rate of the blower fan 38R is large, the airflow rate of the duct 54 can be sufficient. In this case, the temperature rise of the cover member 14A will be further suppressed also in Example 2.

Obviously, the configuration of Example 1 is also sufficiently effective because the duct 54 can improve the cooling performance compared to the conventional configuration that does not have the cover sheet 50.

TABLE 1

|  | Example 1 [PET sheet] | Example 2 [graphite sheet] |
| --- | --- | --- |
| CPU temp. (° C.) | 73.6 | 72.9 |
| GPU temp. (° C.) | 75.2 | 74.7 |
| Key top temp. (° C.) | 32.9 | 32.6 |
| Upper cover member temp. (° C.) | 37 | 37.7 |
| Lower cover member temp. (° C.) | 61.2 | 59.2 |

Reference numeral 58 in FIG. 5 denotes an auxiliary air outlet on the bottom face of the blower fan 38R. This auxiliary air outlet 58 is formed by cutting out a part of the plate of the bottom face of the fan housing 38b, and is located in the rear part of the fan housing 38b including below the air outlet 38a.

The auxiliary air outlet 58 is an opening for circulating part of the air sent by the impeller 38c to the gap G2. The air A from the auxiliary air outlet 58 cools the heat pipes 40, 41 and the heat sink 36R while flowing through the gap G2. The bottom face of the blower fan 38R has a seal member 60 to prevent the air discharged from the auxiliary air outlet 58 from flowing back to the air inlet 38e.

As illustrated in FIGS. 2 and 3, the top face of the left heat sink 36L in this embodiment has the seal member 48 but no cover sheet 50. Of course, this heat sink 36L also may have the cover sheet 50.

The present invention is not limited to the above-described embodiments, and can be modified freely without deviating from the scope of the present invention.

In the above description, the seal member 48 surrounding the top face 36e has a rectangular frame shape. In another embodiment, the seal part 48 may have a three-sides frame enclosing only three sides of the top face 36e.

The invention claimed is:

1. An electronic apparatus comprising:
a chassis having a first cover member defining one outer face opposed along a thickness of the chassis, and a second cover member defining another outer face;
a heating element in the chassis; and
a cooling module in the chassis to cool the heating element,
the cooling module including:
   a blower fan having an air inlet to take in air and an air outlet to discharge air;
   a heat sink having a plurality of spaced apart fins, a first gap between a first face and the first cover member, a second gap between a second face and the second cover member, and a side face intersecting the first and second faces, the side face facing the air outlet;
   a seal member in the first gap and attached to the first face of the heat sink so as to surround the first face; and
   a cover sheet attached to a surface of the seal member so as to cover the first face of the heat sink, thus defining a duct between the cover sheet and the first face to let air from the blower fan pass through the duct.

2. The electronic apparatus according to claim 1, wherein the cooling module further includes: a plate-shaped vapor chamber that absorbs heat from the heating element,
the cover sheet includes a heat conductive sheet made of a heat conductive material, and
the heat conductive sheet has
   a first portion covering the first face of the heat sink, and
   a second portion extending from the first portion and connected to the vapor chamber.

3. The electronic apparatus according to claim 2, wherein the heating element and the heat conductive sheet are connected to different areas on one of a surface and a back face of the vapor chamber.

4. The electronic apparatus according to claim 3, wherein the cooling module further includes a heat pipe that is partially disposed in the second gap, the heat pipe absorbing heat from the heating element and transporting the heat to the heat sink, and
the heat pipe is connected between the other of the surface and the back face of the vapor chamber and the second face of the heat sink.

5. The electronic apparatus according to claim 1, wherein the heat sink has a duct introduction portion that is a chamfer at a corner where the first face and the side face intersect to guide air from the air outlet to the duct.

6. A cooling module configured for mounting in an electronic apparatus, comprising:
a blower fan having an air inlet to take in air and an air outlet to discharge air;
a heat sink having a plurality of spaced apart fins, a first face that is one opposed face in a standing direction of the fins, a second face that is another opposed face, and a side face intersecting the first and second faces, the side face facing the air outlet;
a seal member attached to the first face of the heat sink so as to surround the first face; and
a cover sheet attached to a surface of the seal member so as to cover the first face of the heat sink, thus defining a duct between the cover sheet and the first face to let air from the blower fan pass through the duct.

7. The cooling module according to claim 6, further comprising:
a plate-shaped vapor chamber, wherein
the cover sheet includes a heat conductive sheet made of a heat conductive material, and
the heat conductive sheet has
   a first portion covering the first face of the heat sink, and
   a second portion extending from the first portion and connected to the vapor chamber.

* * * * *